United States Patent [19]

Hosack

[11] Patent Number: 4,926,225
[45] Date of Patent: May 15, 1990

[54] HIGH PERFORMANCE EXTENDED WAVELENGTH IMAGER AND METHOD OF USE

[75] Inventor: Harold H. Hosack, Dallas, Tex.

[73] Assignee: Texas Instruments Incorporated, Dallas, Tex.

[21] Appl. No.: 212,765

[22] Filed: Jun. 29, 1988

[51] Int. Cl.⁵ .................. H01L 29/78; H01L 27/14; H01L 31/00; H01L 29/06
[52] U.S. Cl. ...................... 357/24; 357/30; 357/55
[58] Field of Search ............... 357/24, 30, 55

[56] References Cited

U.S. PATENT DOCUMENTS

| | | | |
|---|---|---|---|
| 4,234,887 | 11/1980 | Vanderslice | 357/24 R |
| 4,513,313 | 4/1985 | Kinoshita et al. | 357/24 LR |
| 4,668,971 | 5/1987 | Hynecek | 357/24 M |
| 4,760,273 | 7/1988 | Kimata | 357/24 LR |
| 4,779,124 | 10/1988 | Hynecek | 357/24 M |

FOREIGN PATENT DOCUMENTS 61-289659 12/1986 Japan ............... 357/24 LR

OTHER PUBLICATIONS

Kosonocky, "Charge-Coupled Devices-An Overview", 1974 Western Electronics Show and Convention Technical Papers, vol. 18, (9/74), pp. 2/1-2/20, reprinted in Melen et al., Eds., *Charge-Coupled Devices: Technology and Applications*, IEEE Press, N.Y., 1977, pp. 28-47.

*Primary Examiner*—Gene M. Munson
*Attorney, Agent, or Firm*—Rodney M. Anderson; Melvin Sharp

[57] ABSTRACT

A CCD imager array is formed at a face (30) of a semiconductor layer (12) and comprises a plurality of CCD cells (34) formed in rows and columns. A plurality of continuous buried gates (27) are each disposed between adjacent columns of the cells (34), and each buried gate (27) extends from the face (30) into the semiconductor layer (12). Each buried gate (27) includes a gate conductor (24) and a gate insulator (26). The buried gates (27) define for each cell (34) a charge collection region (66). A bias voltage source is operable to selectively apply a bias voltage (60) to the buried gate conductors (24), thereby creating a depletion region (64) that substantially includes the charge collection region (66). CCD clock gates (32) are operated independently of the buried gates (27) to read out the charge collected during an integration phase (58). The array of the invention is particularly useful in recording X-ray and near infrared electromagnetic radiation.

20 Claims, 2 Drawing Sheets

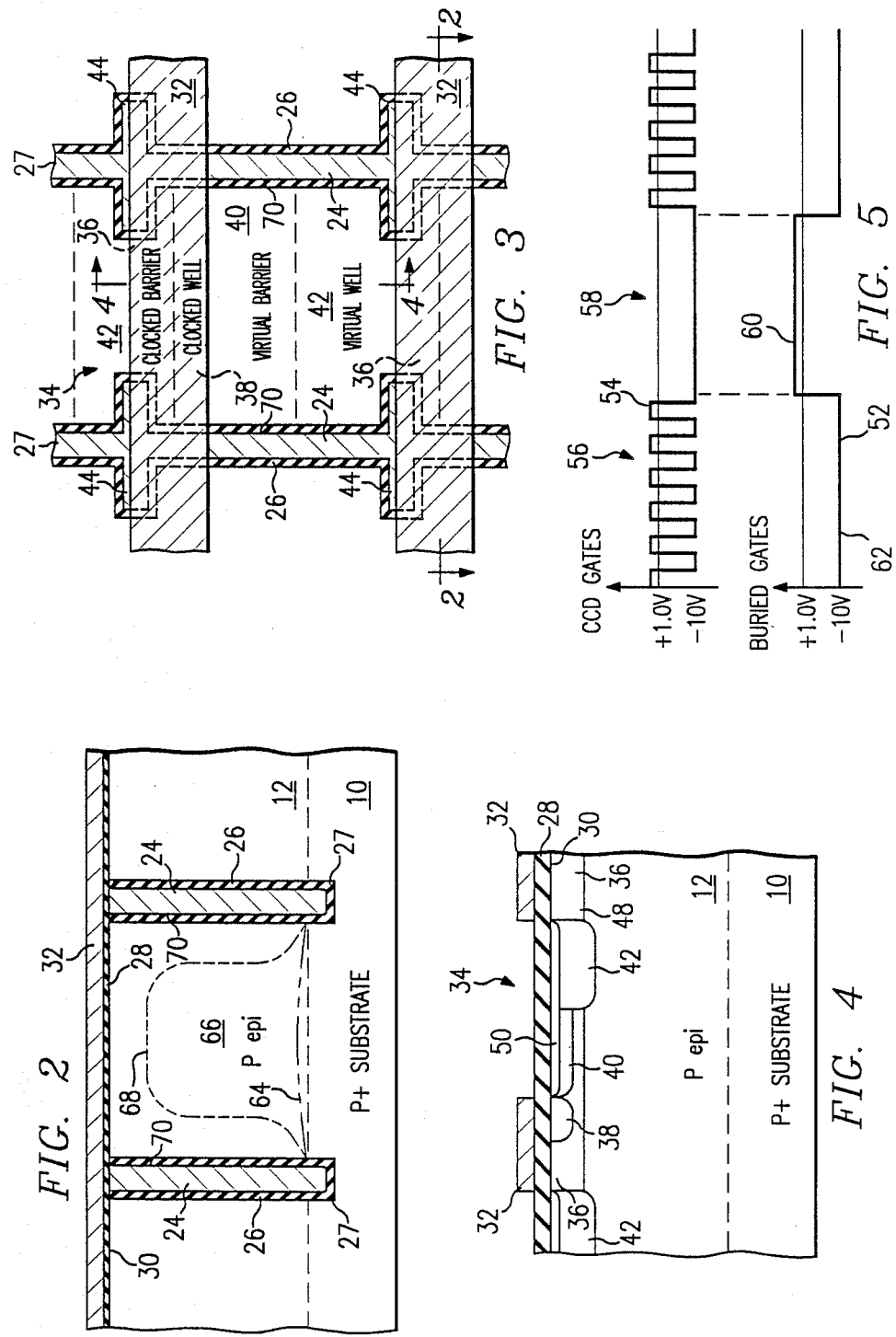

HIGH PERFORMANCE EXTENDED WAVELENGTH IMAGER AND METHOD OF USE

TECHNICAL FIELD OF THE INVENTION

This invention relates in general to CCD imagers, and more particularly relates to a CCD imager array capable of recording and resolving electromagnetic radiation from an extended spectrum.

BACKGROUND OF THE INVENTION

During the past several years, silicon CCD imaging technology has made many significant advances, until today the technology has capabilities for high quantum efficiency, a high modulation transfer function (MTF) and a high resolution over the entire visible spectrum and down into the vacuum ultraviolet, or approximately from 1000 to 6500 Angstroms. Unfortunately, the performance of the conventional CCD silicon structure degrades rapidly outside of this range. In the case of shorter wavelengths, the degradation is due to photon penetration below the usually shallow depletion region. This photon penetration causes charge "cloud" formation when the photon is absorbed, and this "cloud" spreads to neighboring CCD collection sites. Further efficiency is lost because of the loss of charge due to recombination.

In the case of longer wavelengths, the performance problem is also due to the penetration of photons beneath the depletion region, and the subsequent loss of signal and MTF due to charge spreading. This problem must be solved before CCD imagers can be applied to such applications as X-ray imaging for medical and industrial uses, as well as to commercial and military applications in the near infrared, such as detectors for 1.06-micron laser sources.

Researchers have attempted to solve this problem by providing a silicon CCD structure that can gather charge from a very large silicon volume, while still maintaining the capability for small cells and a minimum need for extreme cooling. In the past several years, certain researchers have built CCD's on very high-resistivity silicon. This approach is however very limited in the depletion depth that can be obtained, and because it is susceptible to a large number of defects. In addition, the very deep depletion depths used in this approach result in very large dark currents and very high fields.

A need has therefore arisen for a high-resolution CCD imager that is capable of resolving both the near infrared and X-ray regions without high fields and large dark currents.

SUMMARY OF THE INVENTION

One aspect of the invention comprises an imager cell formed at the face of a semiconductor layer and operable to record electromagnetic radiation including photons penetrating deeply into the layer. A charge collection region is formed to extend from the face into the layer by a depth predetermined to at least equal the depth of penetration into the layer of the photons. At least one conductive gate is formed alongside the charge collection region to extend from the face into the semiconductor layer. A voltage source is coupled to this gate for selectively applying a bias voltage thereto. The application of the bias voltage causes a depletion region that substantially includes the charge collection region. In this manner, charge generated from deeply penetrating photons may be collected in the collection region.

In another aspect of the invention, the charge collection region is disposed adjacent opposed first and second buried gates that extend inwardly into the semiconductor layer from the face and are spaced from each other. A conductor of each buried gate is operable to carry the bias voltage, while an insulator layer is disposed between this conductor and the charge collection region.

Another aspect of the invention comprises an imager array made up of the above-described imager cells The cells are formed in rows and columns, and are separated by a plurality of elongate continuous buried gates. A voltage source selectively applies a bias voltage to these gates. The width between the elongate buried gates, the depth of the buried gate conductors and the bias voltage are preselected such that when the bias voltage is applied, a depletion region for each cell will be formed that substantially includes the charge collection region thereof.

In another aspect of the invention, a method for detecting electromagnetic radiation using the above imager cells includes a charge collection phase in which the bias voltage is applied to the buried gates, and a readout phase in which a second voltage is applied to the buried gates. The second voltage is selected such that the depletion region formed thereby is substantially smaller than the depletion region induced by the bias voltage, thereby militating against smearing but allowing the transfer of charge through each imager cell.

A principal advantage of the invention lies in its provision of deeply extending buried gates into the semiconductor layer. These buried gates may be used to create depletion regions of large volume, while at the same time acting as barriers against charge spreading. These barriers thereby increase the MTF. Since deep volumes of the semiconductor laYer are now isolated for charge collection, deep-penetrating photons of X-ray and near infrared sources can be recorded at high resolution. Versatile imager arrays can therefore be built that can accumulate electromagnetic radiation from the X-ray region all the way to the near infrared, thus making these arrays available for new medical, commercial and military applications.

BRIEF DESCRIPTION OF THE DRAWINGS

Further aspects of the invention and their advantages will be discerned in the following Detailed Description in conjunction with the appended Drawings, in which:

FIG. 2 is a cross-sectional view corresponding to the views shown in FIGS. 1a-1d showing a completed CCD imager cell, and further corresponding to a section taken substantially along line 2—2 of FIG. 3;

FIG. 3 is a plan view of a CCD imager cell in an array according to the invention;

FIG. 4 is a schematic sectional view taken along line 4—4 of FIG. 3; and

FIG. 5 is a timing diagram showing the application of buried gate and clock gate voltages during charge collection and read out phases of operation of the array illustrated in FIG. 2.

DETAILED DESCRIPTION OF THE INVENTION

Figure 1A:
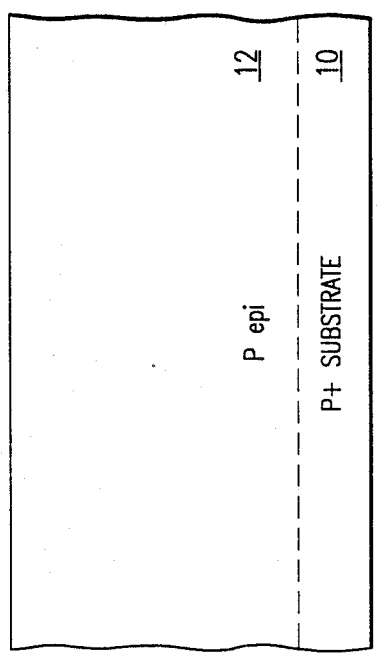
FIGS. 1a-1d are highly enlarged schematic cross sectional views illustrating the formation of buried gates according to the invention.

Referring first to FIG. 1a, there is shown a semiconductor substrate 10 that preferably comprises silicon. Substrate 10 may advantageously be heavily doped to be (P) type. An epitaxial layer 12 is grown on substrate 10 by conventional techniques. Layer 12 may be doped in situ to be (P) type. The dopant concentration in epitaxial layer 12 is lower than in (P+) substrate 10.

Figure 1B:
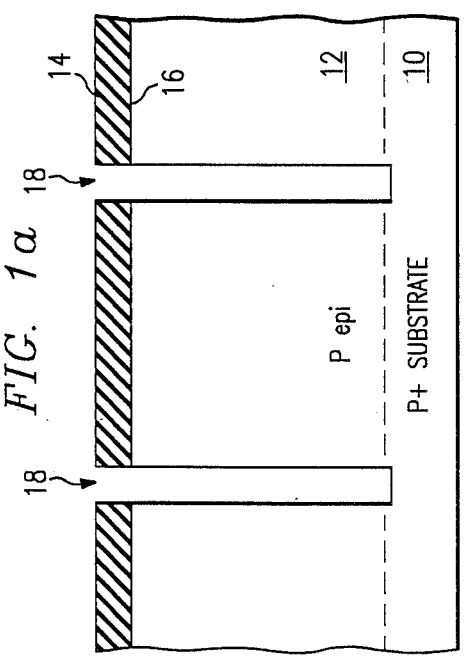

In FIG. 1b, a thick layer 14 of oxide is grown on epitaxial layer 12. Layer 14 is patterned and etched down to a surface 16 of epitaxial layer 12 to expose a plurality of groove areas (not shown) A plurality of grooves 18 are subsequently etched into these exposed areas at least down to, and preferably slightly into, substrate 10 by a reactive ion etch done at 0°. Masking oxide layer 14 is then stripped from surface 16.

Figure 1C:
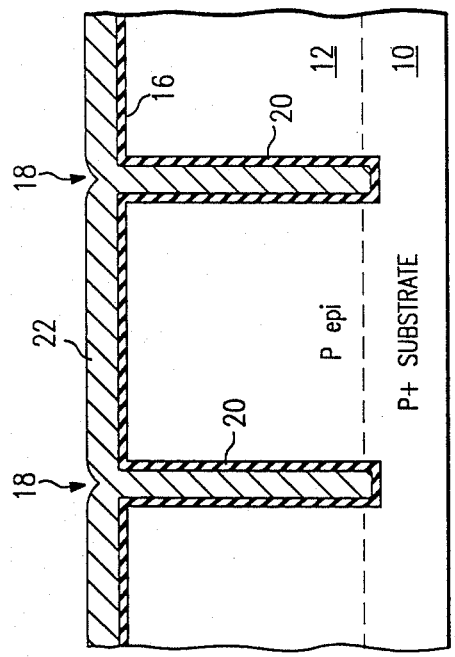

Turning next to FIG. 1c, an insulating layer 20 of oxide is grown on the sidewalls of grooves 18 and over the surface 16 of the epitaxial layer 12. A heavily doped conductive layer 22 such as polycrystalline silicon is next deposited within grooves 18 and over oxide layer 20 on top of epitaxial layer 12.

Figure 1D:
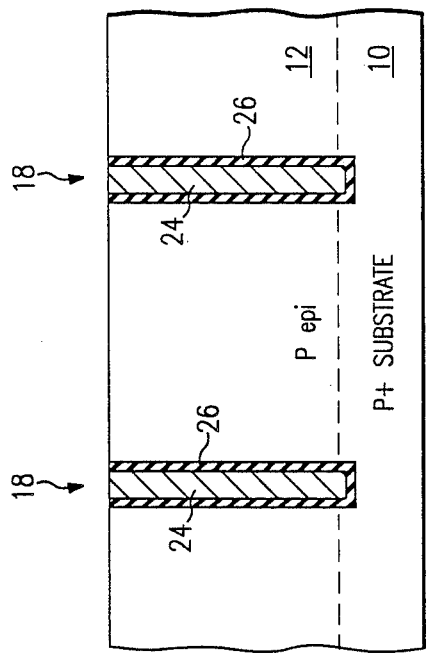

Finally, in FIG. 1d, the entire wafer is polished according to conventional techniques to remove the surface layers of oxide 20 and polysilicon 22. This polishing step leaves a plurality of doped polysilicon buried gate conductors 24 inside grooves 18 and insulated from epitaxial layer 12 and substrate 10 by oxide insulating layer 26.

The completed device is partly shown by the sectional view of FIG. 2, which corresponds to line 2—2 of the plan view shown in FIG. 3, described below. After forming gate conductors 24, various implantation steps are performed to complete the CCD imager cells (described in conjunction with FIG. 4). A gate oxide 28 is grown during or after these implantation steps across the entire new polished surface 30. Polysilicon is next deposited, patterned and etched to define a plurality of CCD clock gates 32 (one shown in FIG. 2). It is preferred that the depth of buried gates 27 be at approximately 25 microns. This preselected depth measurement can vary according to the application of the imager array.

Referring next to FIG. 3, a plan view of a small section of a preferred imager array is shown. The embodiment shown consists of a virtual-phase CCD imager although the invention is equally applicable to 3-array, phase, 2-phase, and 1½-phase CCD imager arrays as well as non-CCD imager arrays such as static induction transistor (SIT) arrays and other arrays employing cells with charge collection semiconductor regions. In the illustrated embodiment, buried gates 27 are elongate and disposed in a columnar direction. CCD clock gates 32 run over the surface of the gate oxide 28 (see FIG. 2) and are disposed in parallel in a row direction.

A single CCD imager cell is indicated generally at 34. Cell 34 in the illustrated virtual-phase embodiment is comprised of four regions: a clocked barrier region 36 and a clocked well region 38, both disposed underneath a respective CCD clock gate conductor 32; and a virtual barrier region 40 and a virtual well region 42 disposed in epitaxial layer 12 between the clock gate conductor 32 of that cell and the clock gate conductor 32 of the next cell. The boundary between clocked barrier 36 and clocked well 38, and the boundary between virtual barrier 40 and virtual well 42, are shown by dotted lines.

Preferably a plurality of projections 44 are formed as extensions of buried gates 27 and extend laterally inwardly from either side of each gate 27 along the boundary between the virtual well 42 of any cell and the clocked barrier 36 of the next cell in a column direction. Projections 44 in the illustrated embodiment are as deep as the rest of gates 27. In the illustrated embodiment, it is preferred that the distance between pairs of projections 44 be less than ten microns, and the distance between straight sidewalls 70 of buried gate conductors 24 be less than about twelve microns. The length of the cell across the clocked barrier, clocked well, virtual barrier and virtual well regions in a columnar direction is typically about 20 microns.

Referring now to FIG. 4, a schematic sectional view of virtual-phase CCD imager cell 34 is taken in a columnar direction along line 4—4 of FIG. 3. In completing the structure from its state shown in FIG. 1d, a buried-channel implant is performed across the entire wafer to create a plurality of buried channels 48 (one shown) that run in parallel to the buried gates 27 in a columnar direction. Buried channels 48 are separated from each other by buried gates 27 (FIGS. 2 and 3) so that no channel stop implantation step need be performed.

After this implantation step, clocked well regions 38 are patterned with photoresist and are implanted with an (N) type dopant such as arsenic. After this point, gate oxide layer 28 may be grown on the face 30 of epitaxial layer 12.

Next, polysilicon gate conductors 32 are deposited, patterned and etched. A self-aligned (N) type virtual barrier implant is then made between the clocked gates 32 to penetrate into the epitaxial layer 12 between gates 32. Before or after this step, a further (N) type implant is performed with a dopant such as phosphorus to create virtual wells 42. This implantation step is partially by self-aligned on one side by an adjacent gate conductor 32, and is aligned on the other side photoresist (not shown). The areas of the virtual barrier implants outside of the virtual well regions 42 become virtual barrier regions 40. Next, gate electrodes 32 are used to self-align a shallow (P+) implant that creates shallow virtual gate regions 50. Virtual gate regions 50 extend over virtual regions 40 and 42.

The operation of the illustrated embodiment can best be described in conjunction with FIGS. 2 and 5. FIG. 5 is a timing diagram showing a bias voltage waveform at 52 and a transfer clock gate waveform at 54. The operation of the device is divided into a readout phase indicated generally at 56 and an integration phase indicated generally at 58. Integration phase 58 can be about 30 milliseconds, which would suit it for high density TV (HDTV) applications The buried gate voltage 52 is supplied to buried gate 27 by a suitable off-array contact. A separate clock voltage source is used to supply CCD gate conductors 32 with voltage waveform 54. In the illustrated embodiment, a charge integration or bias voltage 60 of the buried gate voltage waveform is selected to be +1 volt, while a second voltage 62 of −10 volts is supplied during the readout phase 56.

FIG. 2 illustrates the effect of applying voltages 60 and 62 to buried gates 27. When bias voltage 60 is applied to buried gates 27, a depletion region bounded by a first dashed line 64 extends all the way between the gate pairs 27, and its boundary will be relatively horizontal where the bias voltage is appropriately selected. In this condition, the depletion region 64 is almost coextensive with the charge collection region 66 bounded by gates 27 and substrate 10. Charge collection region 66 comprises clocked barrier region 36, clocked well region 38, virtual barrier region 40 and virtual well region 42.

When the second voltage 62 is applied to buried gates 27, the depletion region will shrink substantially. Its lower boundary in this condition is shown approximately by dashed line 68. The substantial shrinkage of the depletion region reduces the number of charges collected from events sensed during the readout phase of operation, while leaving a small depletion region for the transfer of collected charge from one cell to the next. In this way, smearing can be avoided.

Returning to FIG. 5, while the buried gate voltage 52 is held static at a readout voltage 62, clock gates 32 are pulsed, for example, between +1 volt and −10 volt to transfer charge from one cell to the next according to conventional virtual-phase imager operation. Only a few readout pulses are schematically shown, it being understood that in an actual device there would be hundreds of such pulses within a typical 30-millisecond readout period.

Returning momentarily to FIG. 3, projections 44 are fabricated in order to assure that the depletion region formed between buried gates 27, while the bias voltage 60 (FIG. 5) is applied thereto, will extend all the way across cell 34 at a substantial depth into the epitaxial layer 12. If the bias voltage produces a depletion region which does not extend all of the way between opposed sidewalls 70, the depletion region will still extend across an opposed pair of projections 44, thus creating an enclosure of cell 34 in a columnar direction.

In summary, an extended-wavelength CCD imager array has been shown and described. The performance advantages realized from the invention vary from application to application, depending critically on the particular excitation spectrum being used. For the usual visible wavelength range, the array of the invention would operate similarly to a standard front-side illuminated CCD imager array. For longer wavelengths in the infrared, the evident advantage would be an increase in quantum efficiency over the standard device, as well as maintenance of an essentially ideal square-aperture MTF out to wavelengths approaching the 1.1 silicon bandgap cut off.

For X-ray imaging, there would be two primary advantages. First, the collection efficiency for charge is significantly enhanced over the conventional device. Second, and perhaps more importantly, the charge generated within the region of a single pixel would be isolated to that pixel, and therefore, the presence of "split events," or events where charge generated by a single photon are gathered in two or more cells, would be greatly reduced. This would allow not only for better spatial resolution, but more importantly would allow for the resolution of high energy X-ray photons penetrating deeply into the epitaxial layer 12.

While a preferred embodiment and its advantages have been described in the above detailed description, the invention is not limited thereto but only by the spirit and scope of the appended claims.

What is claimed is:

1. An imager cell formed at a face of a semiconductor layer and operable to record electromagnetic radiation including photons penetrating deeply into said layer comprising:

a charge collection region formed to extend from said face into said layer;

a clocked gate disposed near said face to control the transfer of charge collected in said charge collection region;

a conductive gate disposed adjacent said charge collection region and extending from the face into the semiconductor layer, said conductive gate electrically insulated from said clocked gate; and a voltage source coupled to said conductive gate for selectively applying a bias voltage thereto, said conductive gate operable to induce a depletion region that substantially includes said charge collection region in response to the application of said bias voltage, such that charge generated from deeply penetrating photons will be collected in said collection region.

2. The imager cell of claim 1, wherein said conductive gate is formed to extend from said face into said layer to a depth deeper than that of said charge collection region.

3. The imager cell of claim 1, wherein said depletion region includes only a portion of said charge collection region when said bias voltage is not applied.

4. The imager cell of claim 1, wherein said cell is operable to record electromagnetic radiation including near infrared wavelengths.

5. The imager cell of claim 1, wherein said cell is operable to record electromagnetic radiation including X-ray wavelengths.

6. An imager cell formed at a face of a semiconductor layer, comprising:

a charge collection region of said layer extending into said layer from said face;

first and second opposed buried gates disposed adjacent said charge collection region and spaced from each other by a predetermined spacing, each buried gate extending inwardly a predetermined depth from said face;

a conductor of each buried gate operable to carry a bias voltage thereon and extending inwardly from said face, an insulator layer disposed between said conductor and said charge collection region; and a voltage source coupled to said conductor for selectively applying said bias voltage, said predetermined depth and spacing selected such that the application of said bias voltage induces a depletion region in said semiconductor layer that substantially includes said charge collection region.

7. The imager cell of claim 6, wherein said charge collection region includes a clocked region, a clock gate insulatively disposed over said face and said clocked region and insulated from said conductor of said buried gate, a clock voltage source coupled to said clock gate for selectively applying a clock voltage thereto, the selective application of said clock voltage operable to transfer charge out of said clocked region.

8. The imager cell of claim 7, wherein said charge collection region further comprises a virtual region adjacent said clocked region, the application of said clock voltage operable to transfer charge from said clocked region to said virtual region.

9. The imager cell of claim 6, wherein said conductors of said buried gates extend inwardly from said face by at least said predetermined depth.

10. The imager cell of claim 6, wherein said semiconductor layer comprises silicon, said predetermined depth is approximately 25 microns, said predetermined spacing is less than about 12 microns and said bias voltage is about one volt.

11. The imager cell of claim 6, wherein said voltage source is operable to selectively supply a second voltage to said conductors, said second voltage inducing a charge depletion region that occupies a significantly smaller portion of said charge collection region than the depletion region induced by said bias voltage.

12. The imager cell of claim 6, wherein said semiconductor layer comprises an epitaxial layer of a first conductivity type formed on a substrate of said first conductivity type, said charge collection region extending from said face to about said substrate, said conductors extending inwardly from said face at least to said substrate.

13. An imager array formed at a face of a semiconductor layer, comprising:
   a plurality of array cells formed in rows and columns;
   a plurality of elongate continuous buried gates each disposed between adjacent columns of said cells, each buried gate extending from the face into the semiconductor layer and including a gate conductor and a gate insulator for insulatively spacing said conductor from said semiconductor layer;
   for each cell, a charge collection region disposed in said semiconductor layer between a respective pair of buried gates;
   a voltage source coupled to said gate conductors for selectively applying a bias voltage thereto;
   a width of said charge collection regions, a depth of said buried gate conductors and said bias voltage preselected such that when said bias voltage is applied to said gate conductors, a depletion region in each cell will be formed that substantially includes said charge collection region thereof; and
   reading circuitry for detecting an image based on the charge collected in said charge collection regions.

14. The array of claim 13 wherein said cells are CCD cells, said reading circuitry comprising a plurality of elongate CCD clock gates insulatively disposed over said face in a row direction, said clock gates insulated from said gate conductors of said buried gates;
   a clocked region of each cell formed under each said clock gate, a clock voltage source coupled to said clock gate for selectively applying a clock voltage thereto, such that charge collected within said clocked region will be transferred out of said clocked region responsive to the selective application of said clock voltage to said clock gate.

15. The array of claim 14, wherein each charge collection region further includes a virtual region adjacent said clocked region, said application of said clock voltage operable to transfer said charge from said clocked region to said virtual region, said virtual region disposed adjacent a clocked region of a next CCD imager cell, said clock voltage source operable to selectively apply a second clock voltage to said CCD clock gates to transfer charge from said virtual region to said clocked region of said next cell.

16. The array of claim 13, wherein each cell is divided from adjacent cells occupying the same column by respective boundaries, each said elongate continuous buried gate including a plurality of projections extending laterally inwardly along said cell boundaries, said buried gate projections arranged in opposed pairs such that respective boundary depletion regions will form between each opposed pair of projections in said charge collection region even if said bias voltage is insufficient to form said depletion region to substantially include said charge collection region.

17. The imager array of claim 16, wherein said semiconductor layer comprises silicon, a width between each pair of buried gate projections selected as less than 10 microns, said depth of said buried gate conductors approximating 25 microns, said bias voltage being at least about +1 volt.

18. The imager array of claim 13, wherein said charge collection region of each cell extends vertically from said face to said preselected depth and extends laterally between a pair of said buried gates.

19. A method for detecting electromagnetic radiation by an imager cell formed in a semiconductor layer, comprising the steps of:
   applying a bias voltage to buried gates formed to extend inwardly from the face of the semiconductor layer and disposed adjacent opposed sides of a charge collection region of the cell;
   forming a depletion region that substantially includes the charge collection region responsive to said step of applying the bias voltage; and
   collecting charge in the depletion region responsive to incident electromagnetic radiation while the bias voltage is applied.

20. The method of claim 19, wherein said imager cell comprises a CCD cell, the method comprising the further steps of:
   applying a second voltage to the buried gates such that the depletion region formed thereby is substantially smaller than the depletion region induced by the bias voltage; and
   during said step of applying the second voltage to the buried gates, applying a clocking voltage sequence to a clock gate insulatively disposed over the cell to transfer collected charge out of the cell.

* * * * *